United States Patent
Rozsypal

(10) Patent No.: US 6,377,112 B1
(45) Date of Patent: Apr. 23, 2002

(54) CIRCUIT AND METHOD FOR PMOS DEVICE N-WELL BIAS CONTROL

(75) Inventor: Antonin Rozsypal, Hutisko-Solanec (CZ)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/729,535

(22) Filed: Dec. 5, 2000

(51) Int. Cl.[7] .................................................. H03K 3/01
(52) U.S. Cl. ............................................................. 327/534
(58) Field of Search .................................. 327/530, 534, 327/545, 546, 564, 565, 566

(56) References Cited

U.S. PATENT DOCUMENTS

| | | | |
|---|---|---|---|
| 5,689,209 A | * | 11/1997 | Williams et al. ............ 327/425 |
| 5,767,733 A | * | 6/1998 | Grugett ....................... 327/534 |
| 6,111,455 A | * | 8/2000 | Eleyan et al. ............... 327/537 |
| 6,191,615 B1 | * | 2/2001 | Koga ........................... 326/81 |
| 6,194,952 B1 | * | 2/2001 | Shigehara ................... 327/534 |
| 6,236,259 B1 | * | 5/2001 | Goodell et al. ............. 327/534 |

* cited by examiner

Primary Examiner—Jeffrey Zweizig

(57) ABSTRACT

An N-Well bias control circuit (18) is provided which receives a first voltage ($V_S$) and second voltage ($V_D$) of different magnitudes relating to a battery voltage ($V_{batt}$) and an output voltage ($V_{out}$) of an up/down DC-DC converter. The bias control circuit provides the voltage of largest magnitude to an output node ($V_{N\text{-}Well}$), which is used to properly bias the N-Well region of a PMOS transistor (26) to minimize the probability of latch up. The N-Well bias control circuit may also be modified to deliver the minimum of two voltages, $V_{batt}$ or $V_{out}$, to properly bias the P-Well region of an NMOS transistor.

12 Claims, 2 Drawing Sheets

CIRCUIT AND METHOD FOR PMOS DEVICE N-WELL BIAS CONTROL

FIELD OF THE INVENTION

The present invention relates, in general, to bias control of the well region of a Metal Oxide Semiconductor Field Effect Transistor (MOSFET) device, and more particularly, bias control of an N-well region of a PMOS device.

BACKGROUND OF THE INVENTION

Complimentary MOS (CMOS) processing is used for semiconductors which employ both N-type and P-type devices. The N-type and P-type devices coexist on the same substrate through the use of well regions. The well regions act as isolation boundaries between the N-type and P-type devices and are typically electrically shorted to either the source or drain regions. CMOS devices are used, for example, for up/down, DC-DC voltage regulator controller applications. Both N-type and P-type MOS Field Effect Transistors, NMOS and PMOS, respectively, are used to control current flow from the voltage source, typically a battery. The NMOS device, for example, is typically used to conduct current from the voltage supply or battery to charge the inductor during up-conversion mode. The PMOS device, for example, is then used to conduct current from the inductor during the discharge cycle of the inductor. The PMOS device experiences a higher potential on the drain terminal as compared to the source terminal, for example, during up-conversion mode of the regulator. Down-conversion mode, however, renders the source terminal of the PMOS device at a higher potential than the drain terminal.

Prior art up/down, DC-DC converters which employ the PMOS and NMOS switch topology, typically employ the PMOS device with a fixed electrical connection to either the source or drain regions. Applying a fixed electrical connection to either the source or drain regions, however, can lead to problems such as latch up or leakage. In order to minimize latch up or leakage conditions, the well region of the PMOS and NMOS devices should be electrically shorted to the appropriate source or drain regions as necessary. In the case of a PMOS device, for example, the N-well region should be coupled to the source or drain region which is at the higher potential to minimize latch up probability. Conversely, NMOS devices should have the P-well region coupled to the source or drain region experiencing the lower potential, in order to minimize latch up probability. A need exists, therefore, for a bias control switch, capable of determining the correct bias to apply to the well region in order to minimize the occurrence of latch up.

DETAILED DESCRIPTION OF THE DRAWINGS

Figure 1:
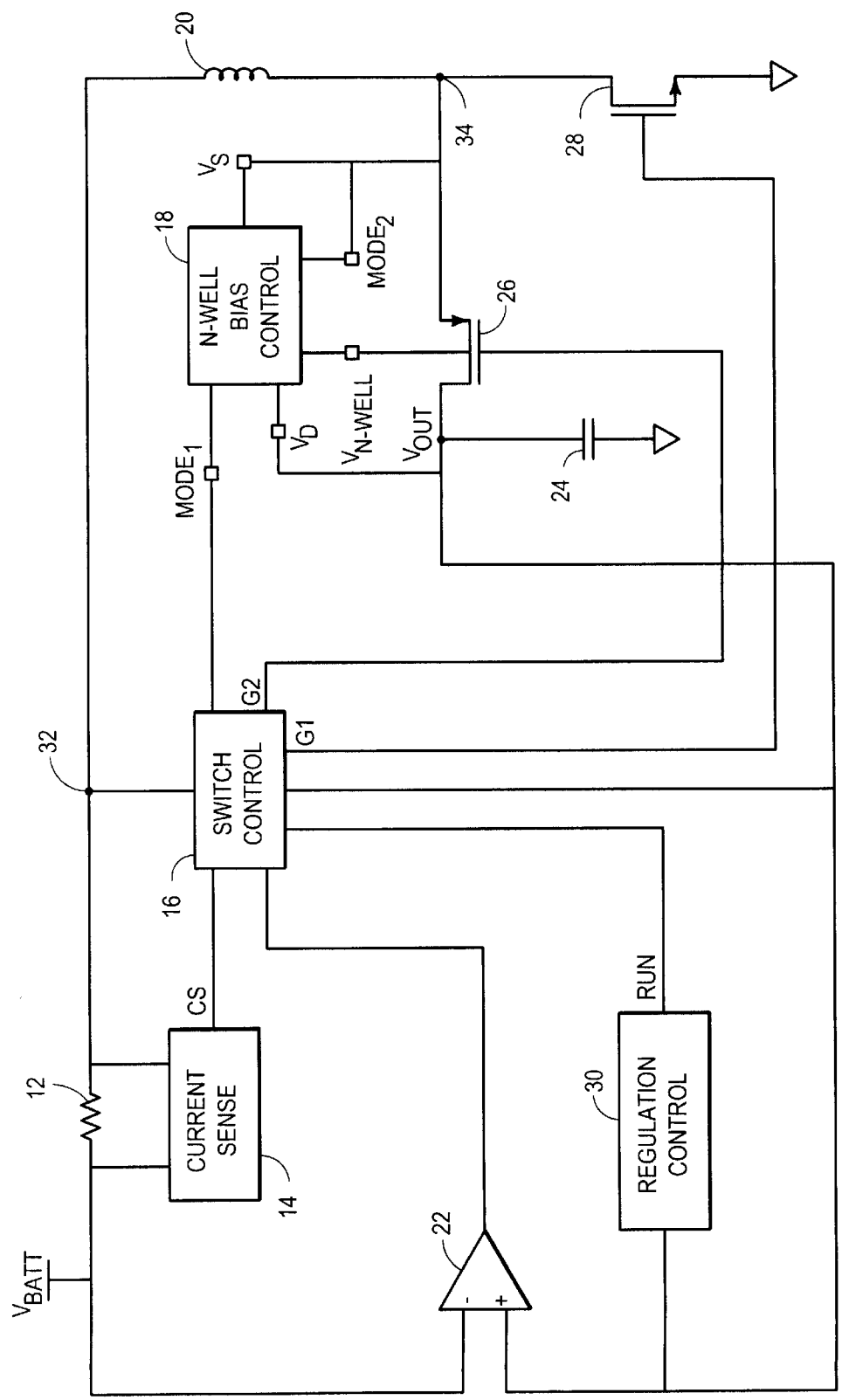
FIG. 1 illustrates a schematic diagram of an up/down, DC-DC converter.

FIG. 1 illustrates an up/down, DC-DC converter 10 utilizing Metal Oxide Semiconductor Field Effect Transistors (MOSFET) 28 and 26, in conjunction with inductor 20 and associated regulation control circuits. In general, converter 10 regulates the output voltage $V_{out}$ to a substantially constant voltage level, while accepting the input voltage $V_{batt}$ from a battery. $V_{out}$ is either regulated to a potential lower than the battery voltage, down-conversion, or is regulated to a potential higher than the battery voltage, up-conversion.

In operation, converter 10 accepts an input voltage from a battery at node $V_{batt}$. The battery voltage is typically in the range of approximately 2.7 volts to 6 volts. The output voltage, $V_{out}$, is regulated to, for example, 5 volts. Converter 10 will be in up-conversion mode for battery voltage, $V_{batt}$, less than 5 volts. Converter 10 will be in down-conversion mode for battery voltage, $V_{batt}$, greater than 5 volts. Converter 10 automatically detects the potential relationship between $V_{batt}$ and $V_{out}$, through the operation of comparator 22. Comparator 22 receives the output voltage at the non-inverting input, from terminal $V_{out}$. Comparator 22 receives the battery voltage at the inverting input from terminal $V_{batt}$. Comparator 22 has a built-in input offset voltage equal to approximately 200 millivolts (mV). The offset voltage is required to assure continuous function of converter 10 when $V_{batt}$ and $V_{out}$ are approximately at the same potential. Down-conversion mode requires at least a 200 mV differential between $V_{batt}$ and $V_{out}$ in order to properly function while up-conversion mode can overlap this range. Comparator 22, in addition, has built in hysteresis, for example 20 mV, which prevents the output of comparator 22 from oscillating between logic high and low voltages when $V_{batt}$ and $V_{out}$ are approximately the same. The conversion mode represented by the output of comparator 22, therefore, is related to input voltages $V_{batt}$ and $V_{out}$ according to Table 1.

TABLE 1

| Input Voltage | Comparator 22 Output |
| --- | --- |
| $V_{out} >= V_{batt} - 200$ mV | UP-Conversion (Logic High) |
| $V_{out} < V_{batt} - 200$ mV | DOWN-Conversion (Logic Low) |

Down conversion mode of converter 10 exists when the battery voltage, $V_{batt}$, is at a higher potential than $V_{out}$. Internal circuitry to switch control 16, determines the maximum of the two voltages, $V_{batt}$ or $V_{out}$, and provides the maximum voltage as logic high levels for signals G1 and G2. At startup, $V_{out}$ is at ground potential and $V_{batt}$ is at, for example, 6 volts. Comparator 22 programs switch control 16 to set the MODE signal to a logic low value, selecting switch control 16 to down-conversion mode. NMOS transistor 28 does not enter into a conductive state while converter 10 is in down conversion mode. PMOS transistor 26 is rendered conductive by switch control 16, by selecting G2 to be logic low. The voltage present at the source terminal of PMOS transistor 26 exceeds the threshold voltage of PMOS transistor 26 making PMOS transistor 26 conductive. PMOS transistor 26 is said to be in a first mode of conduction when signal G2 is at a logic low value. The first mode of conduction, or first phase of inductor current, is also indicated by signal CS asserted to a logic high value, indicating an inductor current, $I_L$, lower than a predetermined threshold current $I_{max}$, for example, 100 milliamps (mA). Current is conducted by inductor 20, through sense resistor 12 and PMOS transistor 26, to charge capacitor 24. At the beginning of the first phase, the inductor current, $I_L$, is zero. In the first phase, the current in the inductor varies according to the applied voltage $V_L$ across the inductor. The inductor current, $I_L$, starts to increase as $di/dt = V_L/L$, where L is the value of inductance associated with inductor 20 and $di/dt$ is the rate of change of current flow through inductor 20. The applied voltage across inductor 20 is approximately equal to $V_L = V_{BATT} - V_{OUT} - V_{12} - V_{26}$, where $V_{12}$ and $V_{26}$ are voltages developed across sense resistor 12 and PMOS switch 26, respectively. Capacitor 24 is relatively large, for example, 10 uF, so the variation of $V_{out}$ during one cycle of inductor current is negligible. Current sense 14 senses the current flow through resistor 12, which is equivalent to the current flow through inductor 20, and at a predetermined amount of current flow, $I_{max}$, detects a maximum current value. The maximum current value, for example, is predetermined to be 100 mA. Once $I_{max}$ is detected by current sense 14, signal CS is set to a logic low value by current sense 14, indicating that the predetermined maximum inductor current, $I_{max}$, is obtained and a second phase of inductor current begins. Signal G2 is set to a logic high value, approximately equal to $V_{batt}$, since $V_{batt}$ is at a potential greater than $V_{out}$.

A logic high value for signal G2, changes the conduction mode of PMOS transistor 26 to a second mode. PMOS transistor 26 is momentarily rendered non-conductive by the mode change. Inductor 20, however, contains stored magnetic energy, which inverts the voltage polarity across inductor 20 to create a voltage rise from node 32 to node 34. The potential at node 34, the source terminal of PMOS transistor 26, exceeds the threshold voltage of PMOS transistor 26, since the gate terminal of PMOS transistor 26 is set to approximately $V_{batt}$ by signal G2 and the source terminal exceeds $V_{batt}$ at least the threshold voltage of PMOS device 26. The polarity of the inductor voltage inverts, which changes the sign of the di/dt term for the equation of $V_L$ above, creating a decreasing inductor current. The second mode of operation renders PMOS transistor 26 conductive once again, but the inductor current is now decreasing from the predetermined maximum value of current flow, $I_{max}$, toward a predetermined minimum value of current flow, $I_{min}$. Once the current flow has decreased to $I_{min}$, for example 50 mA, current sense 14 asserts signal CS to a logic high value and switch control logic 20, de-asserts signal G2 (becoming again logic low), rendering PMOS transistor 26 conductive in the first conduction mode. It can be seen, therefore, that PMOS transistor 26 alternates between two modes of conduction states. The first mode of conduction of PMOS transistor 26 creates an increasing inductor current, $I_L$, indicating a first phase of the inductor current waveform and the second mode of conduction of PMOS transistor 26 creates a decreasing inductor current, indicating a second phase of the inductor current waveform. The inductor current waveform increases from $I_{min}$ to $I_{max}$ during a first phase of the current waveform and decreases from $I_{max}$ to $I_{min}$ during a second phase of the current waveform. While converter 10 is supplying drive current to the load connected to terminal $V_{out}$ (not shown), during first or second phases of the inductor current waveform, converter 10 is said to be in a constant current mode of operation. Signal RUN is asserted to a logic high value by regulation control 30 during the constant current mode of operation.

Since converter 10 is in a down-conversion mode, $V_{out}$ is regulated to some potential below $V_{batt}$–200 mV. Converter 10, for example, regulates from voltage $V_{batt}$ approximately equal to 6 volts to voltage $V_{out}$ approximately equal to 5 volts. Once the output voltage $V_{out}$ has reached the predetermined output voltage of 5 volts, for example, converter 10 changes to a skip mode of operation. Skip mode of operation is defined to be a mode of operation whereby no current is conducted by inductor 20 and the inductor current, $I_L$, falls to 0 amps. The energy stored in capacitor 24 supplies power to the load (not shown) connected to node $V_{out}$. The skip mode of operation is set by regulation control 30, via signal RUN, when $V_{out}$ has obtained a predetermined voltage value. Signal RUN is set to a logic high value to enable constant current mode of operation for converter 10 and is set to a logic low value to enable skip mode operation.

As discussed above, $V_{batt}$ is a voltage supply potential derived from a battery. The magnitude of $V_{batt}$ will decrease as the amount of charge contained within the battery decreases. As the magnitude of $V_{batt}$ decreases below the voltage required at terminal $V_{out}$, converter 10 automatically changes conversion mode from down-conversion to up-conversion. Comparator 22 asserts signal $MODE_1$ to a logic high value through switch control 16 and switch control 16 activates signals G1 and G2 accordingly as needed for up-conversion. Internal circuitry to switch control 16 determines $V_{out}$ is the maximum voltage as compared to $V_{batt}$ and asserts signals G1 and G2 with logic high voltage levels equal to $V_{out}$, as opposed to $V_{batt}$, accordingly.

Up-conversion mode engages both NMOS transistor 28 and PMOS transistor 26. At startup, $V_{out}$ is at ground potential and $V_{batt}$ is at, for example, 3 volts. Since $V_{out}$ is at a potential lower than $V_{batt}$, the $MODE_1$ signal is at a logic low value, which indicates down-conversion mode. The voltage at $V_{out}$ increases as described earlier for down-conversion mode at start up. As the output voltage at node $V_{out}$ increases to a voltage approximately equal to $V_{batt}$–200 mV, the $MODE_1$ signal reverses from indicating down-conversion mode to indicating up-conversion mode, or a logic high value. Regulation control 30 maintains the RUN signal to a logic high value, since the output voltage has not yet reached the predetermined value of, for example, 5 volts. Once the $MODE_1$ signal has transitioned to indicate up-conversion mode, switch control 16 asserts signal G1 accordingly. As converter 10 transitions from down to up-conversion mode, the voltage at terminal $V_{out}$ approximates $V_{batt}$–200 mV. Signals G1 and G2 are asserted to a logic high, or $V_{out}$, rendering NMOS transistor 28 conductive and PMOS transistor 26 non-conductive. Inductor 20 continues to store magnetic energy as the inductor current waveform continues to increase from $I_{min}$ to $I_{max}$, which are predetermined values set by current sense 14 as described earlier. NMOS transistor 28 conducts the inductor current until the inductor current reaches $I_{max}$. Once the inductor current reaches $I_{max}$, NMOS transistor 28 is rendered non-conductive by switch control 16 by de-asserting signal G1 to a logic low value and PMOS transistor 26 is rendered conductive by de-asserting signal G2 to a logic low value. The voltage developed across inductor 20 inverts, maintaining a source voltage at PMOS transistor 26 which exceeds the threshold voltage of PMOS transistor 26. Since PMOS transistor 26 is conductive, inductor 20 continues to supply drive current to charge capacitor 24, with decreasing drive current towards $I_{min}$, consistent with phase two of the current waveform discussed above. Once the current waveform has reached $I_{min}$, phase one of the current waveform repeats to continue the continuous current mode of operation. The voltage across capacitor 24, $V_{out}$, continues to increase toward the predetermined value set by regulation control 30, for example, 5 volts. Once the output voltage has reached 5 volts, regulation control 30 de-asserts signal RUN, programming converter 10 to a skip mode of operation, whereby no current is conducted by either NMOS transistor 28 or PMOS transistor 26. The energy stored in capacitor 24 delivers the required power to the load connected to node $V_{out}$ (not shown). Once the voltage at node $V_{out}$ has transitioned below a predetermined value set by regulation control 30, signal RUN is asserted by regulation control 30 and continuous current mode resumes.

N-well bias control 18 receives signal $MODE_1$ from switch control 16, where signal $MODE_1$ alternates between a logic high value and a logic low value during up-conversion mode and signal $MODE_1$ is at a logic low value during down-conversion mode. The $MODE_2$ terminal is coupled to the $V_s$ terminal. Terminal $V_D$ and $V_S$ are connected to the drain and source terminals of PMOS transistor 26, respectively. The $V_{N\text{-}Well}$ terminal is connected to the N-Well contact of PMOS transistor 26. Up-conversion mode creates a potential at the drain terminal of PMOS transistor 26 which is higher than the potential at the source terminal of PMOS transistor 26 during the charging phase of inductor 20. The N-Well region of PMOS transistor 26, accordingly, should be coupled to the drain terminal of PMOS transistor 26, in order to substantially prevent the well known latch up condition. Up-conversion mode creates a potential at the drain terminal of PMOS transistor 26 which is lower than the potential at the source terminal of PMOS transistor 26 during the discharging phase of inductor 20. The N-Well region of PMOS transistor 26, accordingly, should be coupled to the source terminal of PMOS transistor 26, in order to substantially prevent the well known latch up condition. Conversely, in down-conversion mode, the source terminal of PMOS transistor 26 is at a higher potential than the drain terminal of PMOS transistor 26. The N-Well region, accordingly, should be coupled to the source terminal in order to substantially prevent latch up. N-Well bias control 18 determines the maximum potential present at nodes $V_D$ and $V_S$ and subsequently applies the maximum voltage to terminal $V_{N\text{-}Well}$. N-Well bias control 18, therefore, substantially reduces the well known latch-up condition by alternating the bias voltage coupled to the N-Well region of PMOS transistor 26 according to the conversion mode of converter 10. The N-Well bias circuit of FIG. 2 additionally reduces the parasitic currents induced by the inherent bipolar structures found in lateral MOSFET devices using well regions for isolation. It should be noted that N-Well bias control 18 can be applied in many applications and is not intended to be limited to the application shown in FIG. 1.

Figure 2:
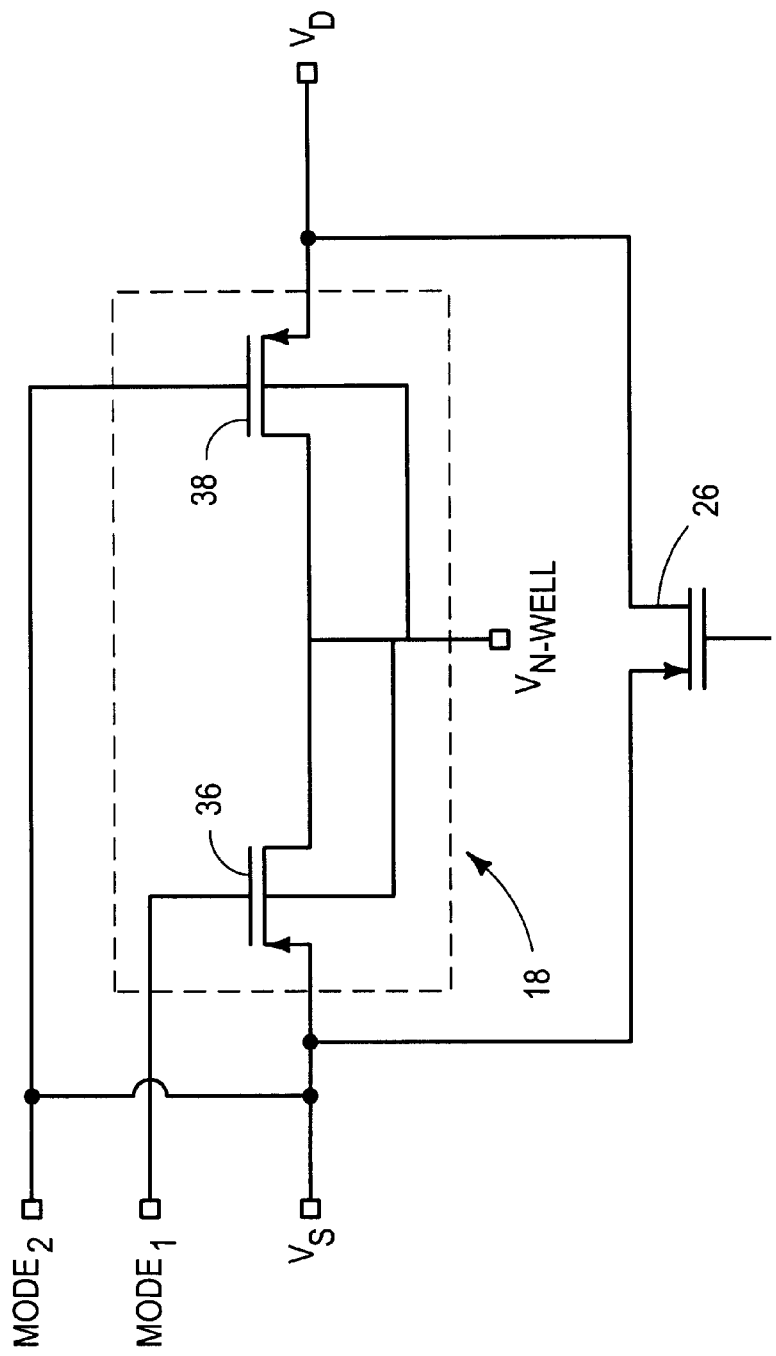
FIG. 2 illustrates the N-well bias control circuit of FIG. 1.

FIG. 2 illustrates a detailed schematic of N-Well bias control 18. The gate terminal of PMOS transistor 36 is coupled to the $MODE_1$ terminal. The source terminal of PMOS transistor 36 is coupled to the $V_S$ terminal. The gate terminal of PMOS transistor 38 is coupled to the $MODE_2$ terminal. The drain terminal of PMOS transistor 38 and the drain terminal of PMOS transistor 36 are coupled together at terminal $V_{N\text{-}Well}$. The N-Well regions of transistors 36 and 38 are coupled together at node $V_{N\text{-}Well}$.

In operation, terminal $MODE_1$ receives a logic level indicative of the conversion mode of converter 10. Terminal $MODE_1$ alternates between a logic high level and a logic low level during up-conversion. Up-conversion mode, as described earlier, defines terminal $V_D$ to be at a higher potential, $V_{out}$, than terminal $V_S$ during the charging phase of inductor 20. Conversely, terminal $V_S$ is at a higher potential than terminal $V_D$ during the discharging phase of inductor 20. Switch control 16, as described earlier, contains internal circuitry to determine the maximum voltage between $V_{batt}$ and $V_{out}$ and accordingly selects the maximum voltage to represent the logic high value set at terminal $MODE_1$. Terminal $MODE_1$, therefore, is at a potential equal to $V_{out}$ for up-conversion mode during the logic high state of signal $MODE_1$.

The gate terminal of PMOS transistor 36 is at a higher potential than the source terminal of PMOS transistor 36 during the inductor 20 charging phase of up-conversion mode, rendering transistor 36 non-conductive. The source terminal of PMOS transistor 38, however, is at a higher potential than the gate terminal of PMOS transistor 38, rendering transistor 38 conductive. Since transistor 38 is conductive, voltage at terminal $V_D$ (where $V_D>V_S$) is transferred via transistor 38 to terminal $V_{N\text{-}Well}$.

The gate terminal of PMOS transistor 36 is at a lower potential than the source terminal of PMOS transistor 36 during the inductor 20 discharging phase of up-conversion mode, rendering transistor 36 conductive. The source terminal of PMOS transistor 38, however, is at a lower potential than the gate terminal of PMOS transistor 38, rendering transistor 38 non-conductive. Since transistor 36 is conductive, voltage at terminal $V_S$ (where $V_S>V_D$) is transferred via transistor 36 to terminal $V_{N\text{-}Well}$.

Down-conversion mode, as described earlier, defines terminal $V_S$ to be at a higher potential, $V_{batt}$, than terminal $V_D$. Terminal $MODE_1$ is at a logic low level, for example, ground potential. The gate terminal of PMOS transistor 36 is at a lower potential than the source terminal of PMOS transistor 36, rendering transistor 36 conductive. The source terminal of PMOS transistor 38, however, is at a lower potential than the gate terminal of PMOS transistor 38, rendering transistor 38 non-conductive. Since transistor 36 is conductive, voltage at terminal $V_S$ (where $V_S>V_D$) is transferred via transistor 36 to terminal $V_{N\text{-}Well}$. It can be seen, therefore, that N-Well bias control device 18, successfully places the higher of the two voltages, $V_{out}$ or $V_{batt}$, at terminal $V_{N\text{-}Well}$, thereby minimizing the probability of latch up. It should be noted that the N-Well bias control circuit of FIG. 2 can be modified to perform a P-Well bias control. P-Well bias control performs the same function as N-Well bias control, except that the lower of the two voltages, $V_{out}$ or $V_{batt}$, are required to bias the P-Well region to prevent latch up. Changes to the schematic of FIG. 2 involves converting PMOS transistors 36 and 38 to NMOS transistors, coupling the $MODE_1$ terminal to the gate terminal of transistor 38 as opposed to transistor 36 and naming terminal $V_{N\text{-}Well}$ to $V_{P\text{-}well}$ to provide P-Well bias as opposed to N-Well bias.

By now it should be appreciated that a bias control circuit has been presented which correctly biases the well region of a MOS device in order to minimize latch up. An advantage of the bias control circuit provides a method to minimize latch up occurrences in both NMOS and PMOS devices. Bias control circuit 18 additionally provides a method to reduce the parasitic currents induced by the inherent bipolar structures found in lateral MOSFET devices using well regions for isolation.

What is claimed is:

1. A bias circuit, comprising:
   a first switch having a control terminal coupled to receive a first control signal, a first conduction terminal coupled to receive a first bias signal and a second conduction terminal coupled to a first node;
   a second switch having a control terminal coupled to the first conduction terminal of the first switch, a first conduction terminal coupled to receive a second bias signal and a second conduction terminal coupled to the first node; and
   a current switch having a well region coupled to receive the first or second bias signal as an output bias signal.

2. The bias circuit of claim 1 wherein the first switch includes a transistor.

3. The bias circuit of claim 2 wherein the transistor includes a p-type device.

4. The bias circuit of claim 1 wherein the second switch includes a transistor.

5. The bias circuit of claim 4 wherein the transistor includes a p-type device.

6. The bias circuit of claim 1 wherein the current switch includes a transistor having a first conductor coupled to the first bias signal and a second conductor coupled to the second bias signal.

7. The bias circuit of claim 6 wherein the transistor includes a p-type device.

8. A bias circuit, comprising:
   a first switch having a control terminal coupled to receive a first control signal, a first conduction terminal coupled to receive a first bias signal and a second conduction terminal coupled to a first node;
   a second switch having a control terminal coupled to receive the first bias signal, a first conduction terminal coupled to receive a second bias signal and a second conduction terminal coupled to the first node; and
   a control device having a well region coupled to the first node to receive the first or the second bias signal and first and second terminals coupled to provide an output signal.

9. The bias circuit of claim 8 wherein the first switch includes a transistor.

10. The bias circuit of claim 9 wherein the transistor includes a p-type device.

11. The bias circuit of claim 8 wherein the second switch includes a transistor.

12. The bias circuit of claim 11 wherein the transistor includes a p-type device.

* * * * *